US009401383B2

(12) United States Patent
Karim (10) Patent No.: US 9,401,383 B2
(45) Date of Patent: Jul. 26, 2016

(54) PHOTOCONDUCTIVE ELEMENT FOR RADIATION DETECTION IN A RADIOGRAPHY IMAGING SYSTEM

(71) Applicant: Karim Sallaudin Karim, Waterloo (CA)

(72) Inventor: Karim Sallaudin Karim, Waterloo (CA)

( * ) Notice: Subject to any disclaimer, the term of this patent is extended or adjusted under 35 U.S.C. 154(b) by 145 days.

(21) Appl. No.: 14/208,702

(22) Filed: Mar. 13, 2014

(65) Prior Publication Data

US 2015/0263061 A1 Sep. 17, 2015

(51) Int. Cl.
*H01L 51/00* (2006.01)
*H01L 27/146* (2006.01)
*H01L 27/30* (2006.01)

(52) U.S. Cl.
CPC .... *H01L 27/14676* (2013.01); *H01L 27/14609* (2013.01); *H01L 27/14685* (2013.01); *H01L 27/14694* (2013.01); *H01L 27/308* (2013.01)

(58) Field of Classification Search
CPC ............... H01L 27/14676; H01L 27/14685; H01L 27/307; H01L 27/14609
USPC ............................................. 257/40, 59, 72
See application file for complete search history.

(56) References Cited

U.S. PATENT DOCUMENTS

| | | | | |
|---|---|---|---|---|
| 4,692,937 A * | 9/1987 | Sashin | ............... | A61B 6/022 378/146 |
| 6,373,062 B1 | 4/2002 | Ghelmansarai | | |
| 2004/0200973 A1* | 10/2004 | Ogawa | ............... | G01T 1/161 250/370.11 |
| 2004/0223587 A1* | 11/2004 | Tsujii | ............... | A61B 6/4233 378/97 |
| 2006/0197007 A1* | 9/2006 | Iwabuchi | ......... | H01L 27/14601 250/208.1 |
| 2008/0164473 A1* | 7/2008 | Tai | ............... | G06F 3/0412 257/59 |
| 2012/0091456 A1* | 4/2012 | Kelley | ............... | H01L 23/573 257/49 |

OTHER PUBLICATIONS

Ghanbarzadeh et al., "Low dark current amorphous silicon Metal-Semiconductor-Metal photodetector for digital imaging applications", IEEE Electron Device Letters, Feb. 2014, pp. 235-237, vol. 35, No. 2, IEEE.

* cited by examiner

*Primary Examiner* — Tu-Tu Ho
(74) *Attorney, Agent, or Firm* — Gowling WLG (Canada) LLP; Jeffrey W. Wong (57) ABSTRACT

This disclosure is directed at a photoconductive element for a digital X-ray imaging system which consists of a detector element comprising a semiconducting layer for absorbing photons, an insulator layer on at least one surface of said semiconducting layer and at least two electrodes on one surface of said insulator layer; and a switching element wherein at least one layer within said switching element is in the same plane as at least one said layer within said detector element.

20 Claims, 6 Drawing Sheets

PHOTOCONDUCTIVE ELEMENT FOR RADIATION DETECTION IN A RADIOGRAPHY IMAGING SYSTEM

FIELD OF THE DISCLOSURE

This invention relates to radiography imaging systems, and more particularly to a photoconductive detector using an insulating contact layer in a radiography imaging system.

BACKGROUND OF THE DISCLOSURE

Traditionally, X-ray diagnostic processes record x-ray image patterns on silver halide films. These systems direct an initially uniform pattern of impinging X-ray radiation through the object to be studied, intercept the modulated pattern of X-ray radiation with an X-ray radiation intensifying screen, record the intensified pattern on a silver halide film, and chemically transform the latent pattern into a permanent and visible image called a radiograph.

Radiographs have been produced by using layers of radiation sensitive materials to directly capture radiographic images as modulated patterns of electrical charges. Depending on the intensity of the incident X-ray radiation, electrical charges generated either electrically or optically by the X-ray radiation within a pixelized area are quantized using a regularly arrange array of discrete solid state radiation sensors.

Recently, there has been rapid development of large area, flat panel, digital X-ray imagers for digital radiology using active matrix technologies used in large are displays. An active matrix consists of a two-dimensional array (of which, each element is called a pixel) of thin film transistors (TFTs) made with a large area compatible semiconductor material including among others, amorphous silicon, polycrystalline silicon, sputtered metal oxides, and organics. There are two general approaches to making flat-panel x-ray detectors, direct or indirect. The direct method primarily uses an amorphous selenium photoconductor as the X-ray to electric charge converting layer coupled directly to the active matrix. In the indirect method, a phosphor screen or scintillator (e.g. CsI, GdOS etc) is used to convert X-rays to light photons which are then converted to electric charge using an additional pixel level light sensor fabricated with the TFT on the active matrix array.

In prior art imaging systems, the pixel level light sensor disclosed is a vertical photodiode or alternately, a lateral metal-semiconductor-metal (MSM) photoconductor as taught in U.S. Pat. No. 6,373,062 B1: Interdigital photodetector for indirect x-ray detection in a radiography imaging system.

The key challenges with fabricating a vertical photodiode are the modifications required to the thin film transistor fabrication process specifically, thick amorphous silicon layers, specialized p doped contact layer and a complex RIE sidewall etching process to prevent optical crosstalk. These challenges reduce the fabrication yield and drive up the cost of manufacture. The key challenges with fabricating a lateral MSM photoconductor include the high dark currents at higher electric fields and photoresponse non-uniformity due to a non-uniform electric field. Both issues degrade performance, which is the key reason why MSM devices are not used in industry today for large area digital X-ray imaging. Accordingly, a need exists for a photodetector for use in flat-panel radiographic detectors that can mitigate the process yield and cost issues with vertical photodiodes while overcoming the device performance limitations in the MSM structures.

SUMMARY OF THE INVENTION

The present invention meets this need and provides system and method aspects for a lateral Metal-Insulator-Semiconductor-Insulator-Metal (or MISIM) photoconductive element integrated with a switching element for a radiography imaging system. The photoconductive element includes a semiconducting layer for absorbing photons, an insulator layer placed on the semiconducting layer and two electrodes placed on the insulating layer.

The insulator layer placed between the semiconducting layer and lateral sensor contacts performs the function of reducing the dark current of photoconductor even when a high electric field is applied across the sensor contacts. Applying the high electric field enables the MISIM photoconductive element to operate at a faster speed than conventional metal-semiconductor-metal (MSM) photoconductor designs and also to increase the collection efficiency of the electron hole pairs created by the photons impinging on the semiconducting layer. The structure of the present invention is simpler and correspondingly less expensive to manufacture in comparison to a traditional photodiode structure. Moreover, unlike traditional MSM photoconductors, the structure of the present invention yields higher performance and can be realized in a large area display electronics manufacturing process. These and other advantages of the aspects of the present invention will be understood in conjunction with the following detailed description and accompanying drawings.

The concept of the MISIM detector, which led to this invention, is described in the following article: (1) S. Ghanbarzadeh, S. Abbaszadeh and K. S. Karim, "Low dark current amorphous silicon Metal-Semiconductor-Metal photodetector for digital imaging applications", IEEE Electron Device Letters (2014). However, the inventive aspects of the actual implementation of the MISIM photoconductive element for large area digital radiography are not described and form the basis of the present application.

DETAILED DESCRIPTION

The present invention relates to a novel photoconductive element that includes a MISIM detector integrated with a switching element for a radiography imaging system. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be merely limited to the embodiment shown but is to be accorded the widest scope consistent with the principles and features described herein.

Figure 1:
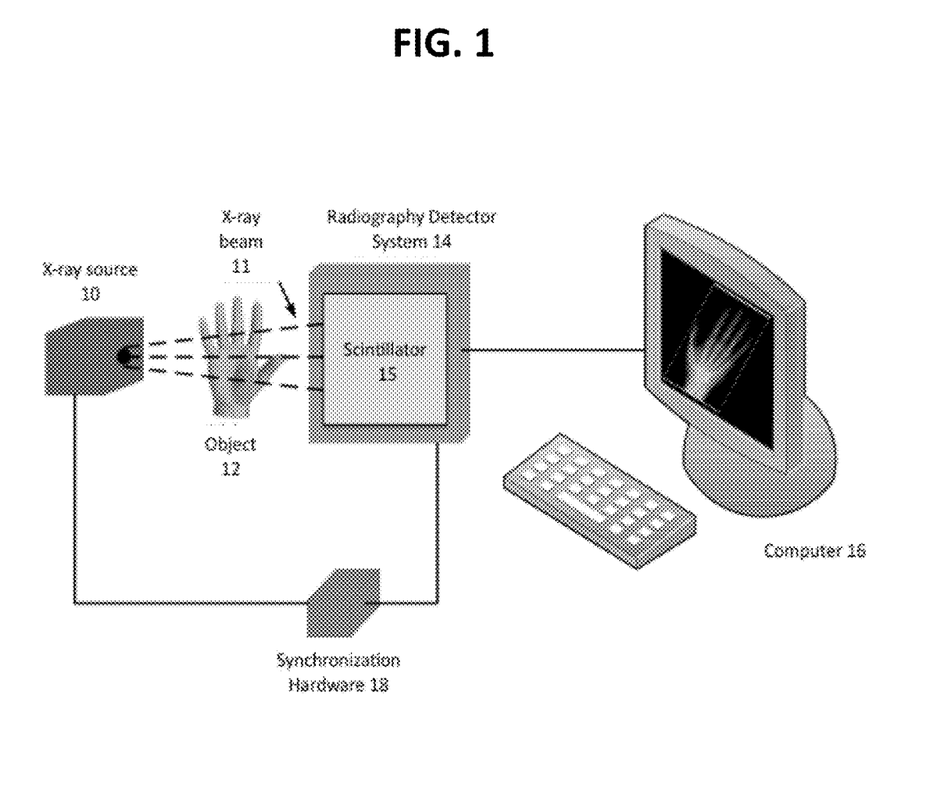
FIG. 1 illustrates a general diagram of a radiographic imaging environment in accordance with the present invention.

FIG. 1 illustrates a general diagram of a radiographic imaging environment in accordance with the present invention. As shown, an X-ray source 10 generates an X-ray beam 11 that is transmitted toward an object 12, e.g., a patient's hand, for imaging by a radiography detector system 14 and viewing on a Computer 16. For some radiography detector systems 14, synchronization hardware 18 is necessary to get the correct timing between the X-ray source 10 and the radiography detector system 14 that is sampling the impinging X-ray beam 11. In the present invention, the radiography detector system 14 utilizes a large area, flat panel detector based on active matrix technologies to achieve the imaging of object 12. In general, the object 12 to be imaged is positioned between the radiation source 10 and the radiography detector system 14. X-rays, which pass through the object 12 interact with the radiography detector system 14. In direct imaging, the x-rays generate electronic charge within the radiography detector system 14 and there is no need for the Scintillator 15. In indirect imaging, the x-rays generate light photons as they pass through a phosphor screen or Scintillator 15, such as CsI, GOS or CaWO4 (Calcium Tungsten Oxide). These indirectly generated light photons then further generate electronic charge within the radiography detector system 14.

Figure 2:
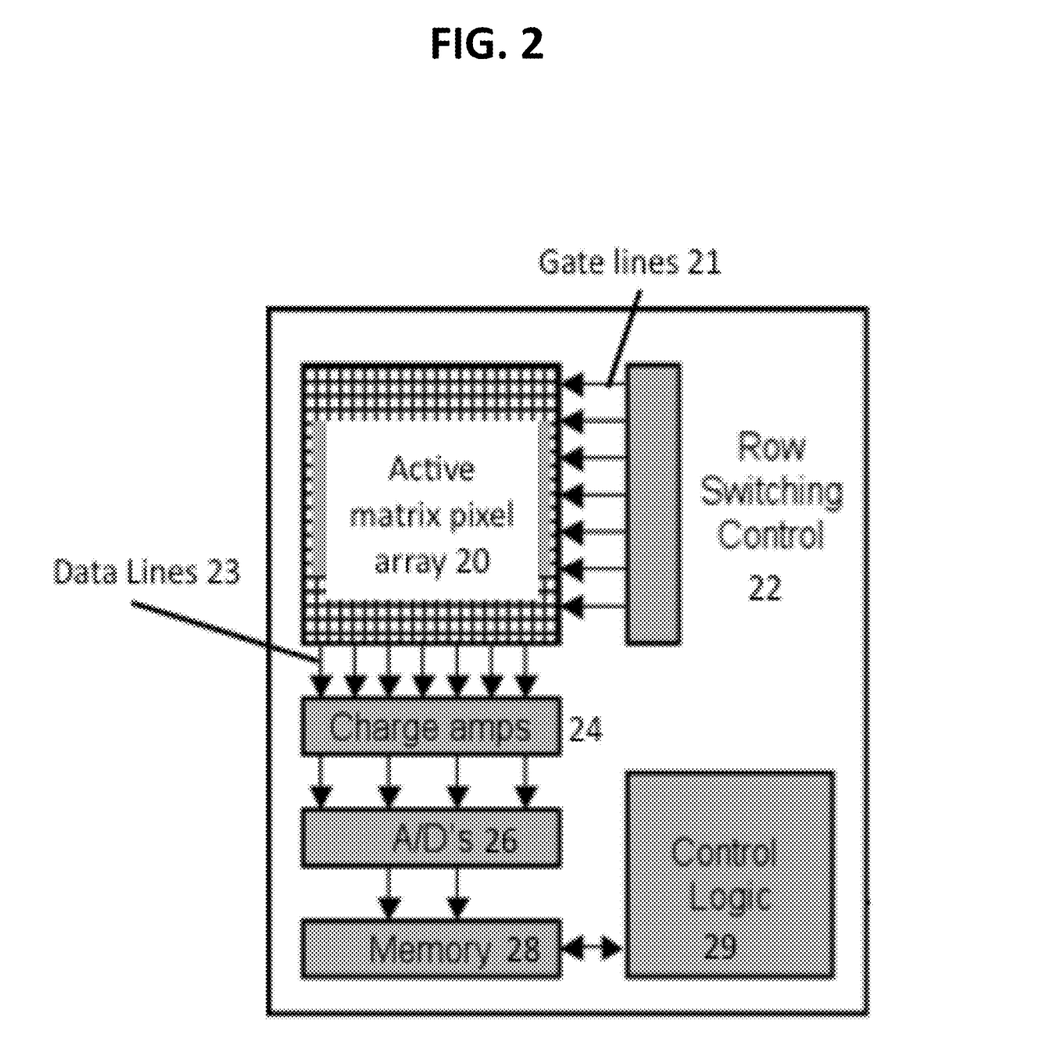
FIG. 2 illustrates a two-dimensional active matrix imaging array structure in accordance with the present invention.

FIG. 2 shows the components of the radiography detector system 14. An active matrix pixel array 20 comprises of a two-dimensional matrix of pixel elements where electronic charges generated directly or indirectly by incident x-rays are sensed and stored. To access the stored charge at each pixel, Gate lines 21 are driven typically sequentially by a Row Switching Control 22 causing all pixels in one row to output their stored charge onto Data lines 23 that are coupled to Charge amplifiers 24 at the end of each active matrix pixel array 20 column. The charge amplifiers 24, that may perform a multiplexing function in addition to their typical amplifying function, send the pixel charge data to analog to digital converters (A/D's) 26, where the analog signal is converted to a digital representation which is then be stored in memory 28 awaiting transmission to the Computer 16 at a time determined by the Control Logic 29.

Figure 3:
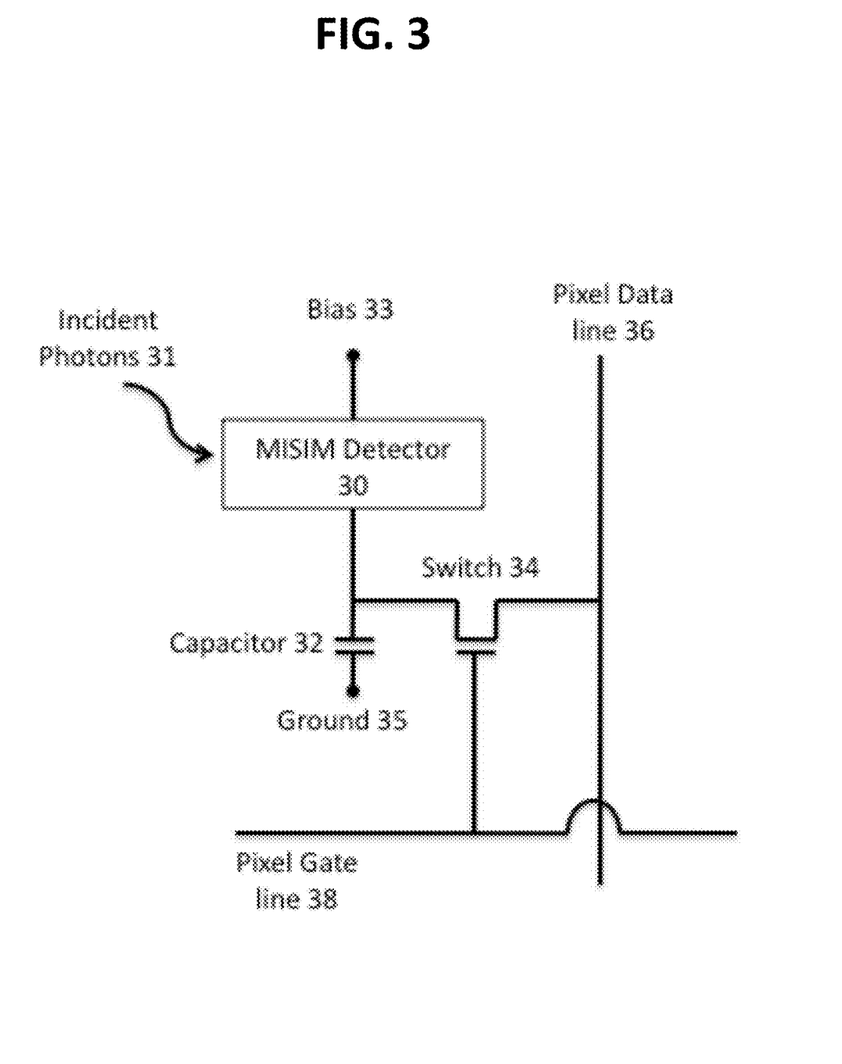
FIG. 3 illustrates a pixel circuit architecture in accordance with the present invention.

FIG. 3 shows the pixel level circuit for one pixel in the active matrix pixel array 20 described in FIG. 2, which typically contains a plurality of pixels. Within each pixel is a two terminal MISIM detector 30 that absorbs the incident photons and generates electronic charge, a two terminal optional capacitor 32 to stored the converted electronic charge and a switch 34, typically a three electrode thin film transistor (TFT) switch for transferring the electronic charge off the pixel. One electrode of the MISIM detector 30 is connected to a high potential Bias terminal 33 that is shared with other pixels in the active matrix pixel array 20 and one electrode of the Capacitor 32 is connected to a low potential Ground terminal 35 which is also shared with other pixels in the active matrix pixel array 20. The drain electrode of the TFT switch 34 is connected to both, the second electrode of the MISIM detector 30 and the second terminal of the Capacitor 32. The source electrode of the TFT 34 is connected to the Pixel Data line 36 which is coupled to one of the plurality of Data lines 23 described in FIG. 2. The gate electrode of the TFT 34 is connected to the Pixel Gate line 38 which is coupled to one of the plurality of Gate lines 21 described in FIG. 2.

Figure 4:
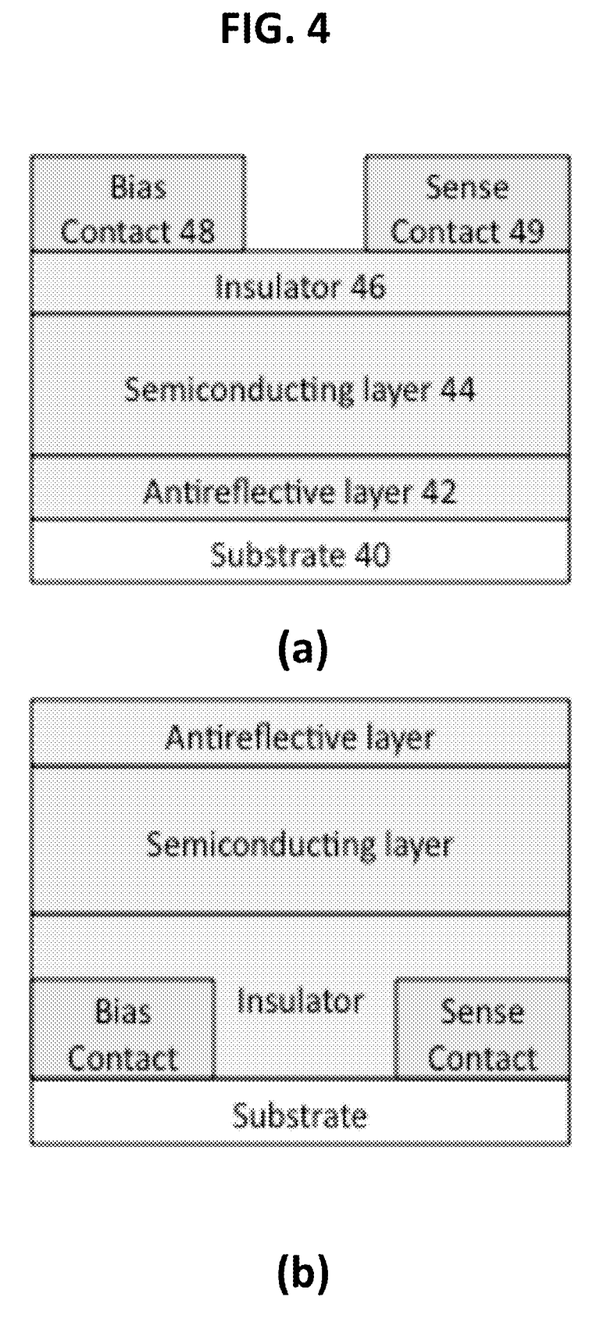
FIG. 4 illustrates a cross-section of a Metal-Insulator-Semiconductor-Insulator-Metal (MISIM) detector in a top electrode and bottom electrode configuration in accordance with the present invention.

FIG. 4a shows a cross-section of the MISIM detector 30 in a top electrode configuration. In this instance, there is a substrate 40 (typically glass or plastic) with the following layers deposited in sequence: an antireflective layer 42, a semiconducting layer 44, an insulator layer 46 and a patterned contact layer yielding at least two contacts, one bias contact 48 and one sense contact 49. Note that the anti-reflective layer is optional and not necessary for correct working of the MISIM detector 30. However, in indirect conversion imaging, it typically enhances performance by increasing the percentage of light photons impinging on the semiconducting layer 44 where photons are absorbed. In FIG. 4b, a cross-section of the MISIM detector 30 in a bottom electrode configuration is shown. Here the sequence is reversed: first there is the patterned contact layer containing the bias and sense contacts followed by an insulator layer, semiconducting layer and the optional antireflective layer.

Dark current is a key problem with traditional MSM detectors because it reduces the detector dynamic range and image quality and is a function of the electric field applied on the bias contact 48. A large electric field is necessary for charge separation of the electronic carriers generated from the impinging photons on the semiconducting layer 44. If photocurrent can be maintained at a high level while dark current is reduced or alternately, a higher electric potential can be applied to the bias contact 48 to increase charge separation efficiency and correspondingly the photocurrent, without increasing the dark current, then a larger photo-to-dark current ratio is possible which equates to better dynamic range, higher contrast, higher quantum efficiencies and better digital images. Neither ohmic nor blocking contacts for the bias 48 and sense 49 contacts have to date been able to achieve the dark current densities necessary for sensitive medical radiography imaging applications (around 10 pA/mm$^2$ or less). In addition, insulating contacts are typically not considered viable because of the anticipated slow response times and the potential for charge build-up on the insulating layer that can lead to reliability concerns.

The present invention uses a specific insulator layer 46 that simultaneously: (1) reduces dark currents when there are no photons impinging on the semiconducting layer 44 and (2) enables high photocurrents when photons impinge on the semiconducting layer 44. To achieve these two goals, the material of the insulator layer 46 must be carefully selected to both, provide a good interface with the semiconducting layer and to have a dielectric strength such that it can be operated in soft (reversible) breakdown during device operation repeatably when the applied bias and insulator layer 46 thickness are optimized to take into account both the dark conductivity and photoconductivity of the semiconducting layer 44 which is also a function of semiconducting layer 44 thickness, applied electric bias and material properties.

When photons are impinging on the semiconducting layer 44 thereby causing the resistivity of the semiconducting layer 44 to decrease, the insulator layer 46 operates in soft (i.e. reversible) breakdown mode allowing a vertical conduction path from bias 48 and sense contacts 49 through the insulator layer 46 to the semiconducting layer 44. Operating in soft breakdown allows for conduction through the insulator layer 46 which can overcome the response time challenge while still maintaining a low dark current by limiting bias 48 and sense 49 contact injection currents. Using an insulator layer 46 that is too thick or with a high dielectric breakdown strength can yield poor results or alternately, choice of an incompatible insulator layer 46 material can yield a poor interface with the semiconducting layer 44 so that traps and defects cause a drop in MISIM detector 30 quantum efficiency.

For example, we determined that using a 450 nm amorphous silicon semiconducting layer 44 works well with a 300 nm polyimide insulator layer 46 and yields a good quality interface with high external quantum efficiency (above 65%) for green light. Alternately, if high external quantum efficiency is required for blue light, then, for the same amorphous silicon and polyimide material system, the semiconducting layer 44 thickness may need to be reduced which requires a corresponding re-optimization of the insulator layer thickness 46. If the semiconducting layer 44 is changed from amorphous silicon to a metal oxide like IGZO or even polysilicon, both of which have different material properties and absorption coefficients, the choice of insulator layer material (for interface purposes), thickness and maximum bias voltage applied need to be re-optimized.

Moreover, it must be emphasized that using an insulator layer 46 as opposed to simply patterning the insulating contacts above the bias 48 and sense 49 contacts can lead to a better overall interface with the semiconductor layer 44 with fewer defects and traps as well as encapsulating the semiconducting layer 44 in the longterm thus maintaining higher quantum efficiency. A patterning process (e.g. of the bias 48 or sense 49 contacts or the insulator layer 46) may degrade the semiconducting layer 44 interface because of exposure to air and chemicals during the patterning process.

Furthermore, if the bias 48 and sense 49 contacts are made using transparent materials, the insulator layer 46 can serve an additional function such as being an anti-reflective layer, which will allow additional photons to reach the semiconducting layer 44 through the now transparent contacts.

Figure 5:
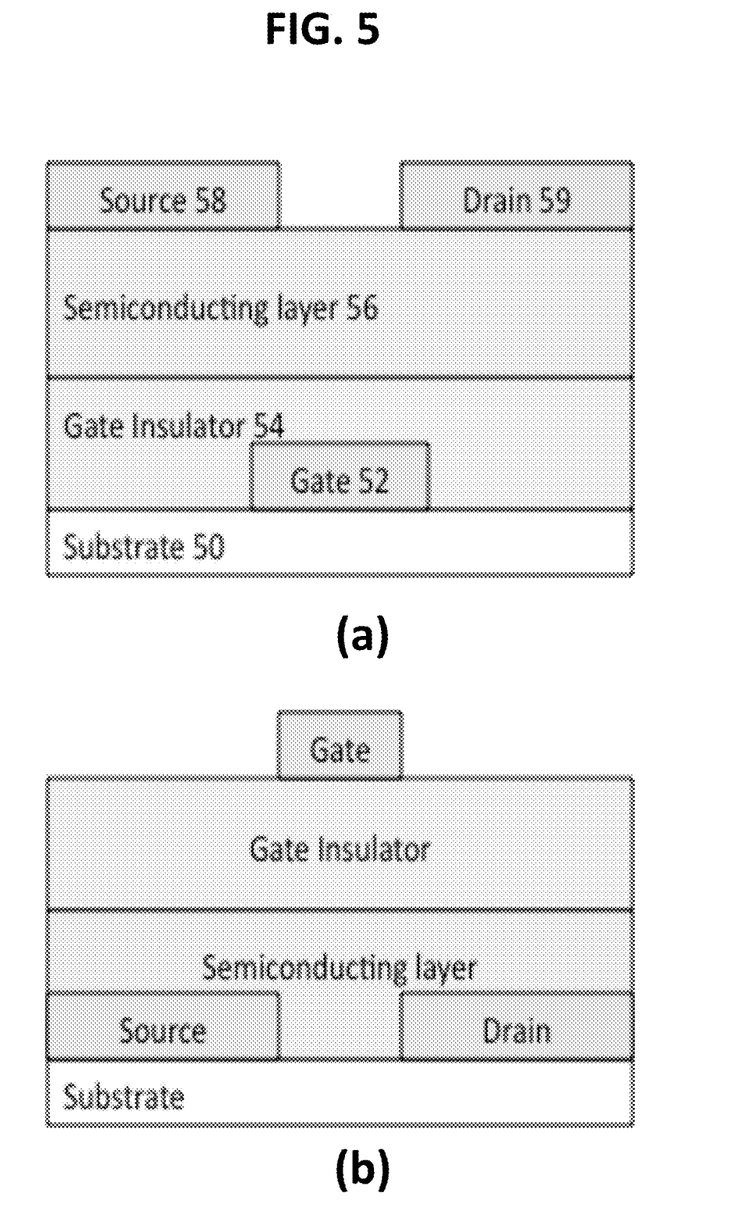
FIG. 5 illustrates a cross-section of a bottom-gate and top-gate thin film transistor (TFT) configuration in accordance with the present invention.

FIG. 5a shows a bottom gate, inverted staggered thin film transistor (TFT) structure where a substrate 50 (e.g. glass or plastic) contains a patterned gate electrode 52, followed by a gate insulator 54, a semiconducting layer 56 and a patterned contact layer defining the source 58 and drain 59 contacts. FIG. 5b shows a top gate, inverted staggered TFT structure with the layers in a reverse configuration. Both are implementations of amorphous silicon TFTs in use by the display industry today. Similar cross-sections can be drawn for IGZO and polysilicon TFTs as understood by one skilled in the art.

Figure 6:
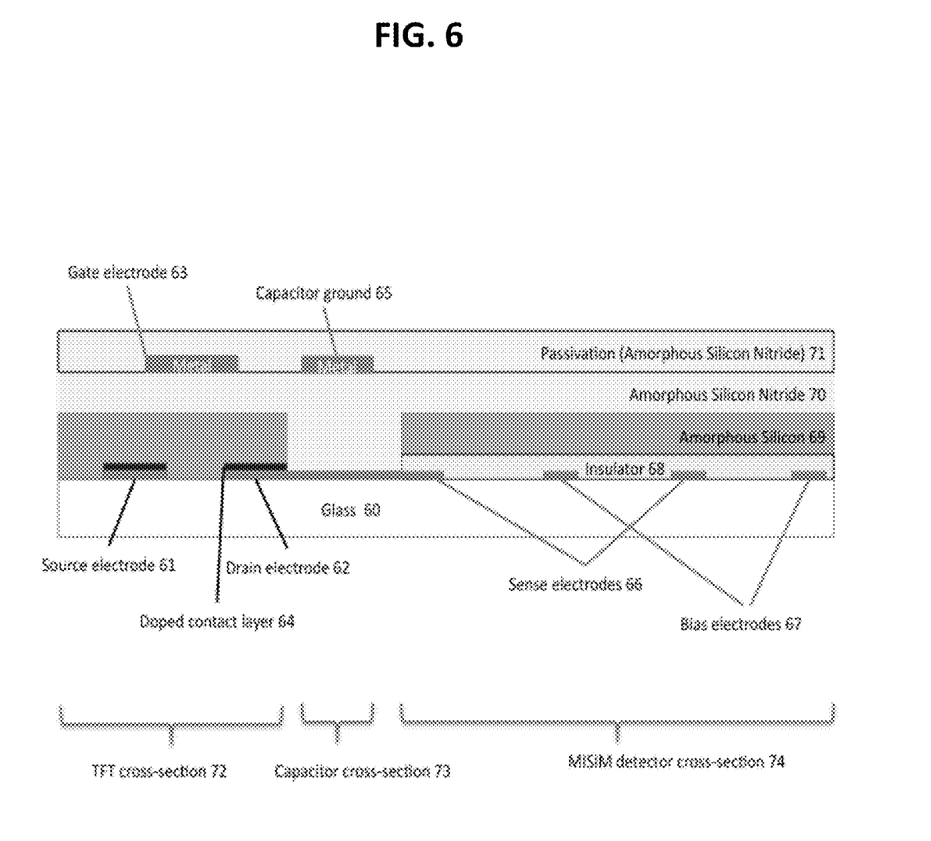
FIG. 6 illustrates a cross-section of a pixel implementation of an MISIM detector co-planar with a TFT switch in accordance with the present invention.

FIG. 6 shows a cross-section of a photoconductor element using a co-planar implementation. The element components can be mapped to the pixel level circuit shown in FIG. 3, which consists of an amorphous silicon MISIM detector 30, a capacitor 32 and an amorphous silicon TFT switch 34. In FIG. 6, the MISIM detector cross-section 74 contains Bias electrodes 67 and Sense electrodes 66 in a commonly known comb electrode configuration along with a polyimide insulator layer 68 (which could be, among others, amorphous silicon nitride, amorphous silicon oxide, amorphous silicon oxynitride, benzocyclobutene (BCB), or polystyrene), a semiconducting layer of amorphous silicon 69 (or alternately, one or more of molybdenum sulphide, Indium Gallium Zinc Oxide, polycrystalline silicon, amorphous selenium, mercuric iodide, lead oxide, microcrystalline silicon, nanocrystalline silicon, crystalline silicon, PTCBI, or CuPc), an amorphous silicon nitride antireflective layer 70 and a further amorphous silicon nitride passivation layer 71. The capacitor cross-section 73 shows the bottom plate shared with the sense electrode 60 along with a top capacitor plate connected to ground 65, typically a low electric potential. The capacitor dielectric in this case is amorphous silicon nitride 70, and is shared with the anti-reflective layer in the MISIM detector cross-section 74. The TFT cross-section 72 consists of a source electrode 61 connected to the pixel data line 36 from FIG. 3. Also shown is a gate electrode 63 connected to the pixel gate line 38 in FIG. 3. The drain electrode 62 is connected to the sense electrodes 66 and forms one plate of the capacitor shown in the capacitor cross-section 73. For the TFT cross-section 72, an amorphous silicon layer 69 is the active layer and this is shared with the MISIM detector cross-section 74. The TFT gate dielectric is formed by an amorphous silicon nitride layer 70, shared with the anti-reflective layer shown in the MISIM detector's cross-section 74 and the capacitor's dielectric layer.

One of the benefits of the co-planar design shown in FIG. 6 allows for shared uses of multiple layers, for example, the TFT gate dielectric can serve as an anti-reflective coating for the MISIM detector 30. In contrast, in a PIN diode, the unique amorphous silicon PIN isolation process and the thick semiconductor layer required to absorb green photons typically precludes sharing of any layers except metal contacts. In addition, the PIN diode sidewalls need to be etched carefully and passivated to prevent excess leakage current. In the MISIM detector 30, because the conduction path is horizontal, the horizontal interface is primarily important. As described earlier, using the insulator layer 46 helps protect the interface to the semiconducting layer 44. Thus, device performance remains stable in the long term even if the MISIM detector 30 is built in a standard TFT switch 34 manufacturing process.

Since the MISIM does not have a p+ doped layer like the PIN photodiode, blue light emitting phosphors can work. The MISIM detector 30 disclosed can use any one of a number of insulating layers between the contact electrodes and the amorphous silicon, i.e. polyimide, polystyrene, amorphous silicon nitride, amorphous silicon oxide or amorphous silicon oxynitride. Similarly, the antireflecting layer can be a layer of the same set as described above.

To detect X-rays indirectly, the scintillating phosphor 15 can be placed on either side of the radiography detector system 14. In the device architecture shown in FIG. 6, it is preferable for the scintillator 15 to be placed on top i.e. adjacent to the passivation layer 71. This is because the semiconducting layer 44 would now be exposed fully to incident light from the scintillator 15 resulting in a higher absorption of incident light and thus, better quantum efficiency. If the scintillator 15 is placed on the bottom (i.e. adjacent to the glass 60), then there could be a loss of spatial resolution due to the thickness of the glass 60, additional process complexity due to need for a TFT back gate (not shown) to prevent incident light from the scintillator falsely turning the TFT ON, and loss in quantum efficiency if the electrodes are opaque and block light from reaching the amorphous silicon 69 semiconducting layer.

The implementation shown in FIG. 6 uses a top gate TFT switch 34 and a bottom electrode MISIM detector 30. It should be noted that additional implementations are possible that use a combination of either a top or bottom gate TFT switch and a top or bottom electrode MISIM detector. The ideal combination would have the drain electrode 62 of the TFT and the sense electrodes 66 of the MISIM on the same plane (as shown in FIG. 6) to save on having an additional space consuming via that runs through the semiconducting layer of amorphous silicon 69. Moreover, if transparent drain 62, source 61, sense 66 and bias 67 electrodes are used, a bottom gate TFT switch 34 along with a top electrode MISIM detector 30 can potentially achieve similar performance as the implementation in FIG. 6.

What is claimed is:

1. A photoconductive element for a digital X-ray imaging system, the photoconductive element comprising:
   a detector element including:
      a semiconducting layer for absorbing photons;
      at least two detector element electrodes spaced laterally apart; and
      an insulator layer having at least a first surface and a second surface wherein the first surface is in contact with the semiconducting layer and the second surface is in contact with the at least two detector element electrodes, the first and second surfaces being distinct from each other; and
   a switching element wherein at least one layer within said switching element is in a same plane as either the semiconducting layer or the insulator layer of the detector element;
   wherein at least one of the at least two detector element electrodes is transparent.

2. The photoconductive element of claim 1 wherein said detector element further comprises an anti-reflection layer.

3. The photoconductive element of claim 1 wherein said switching element comprises a thin film transistor.

4. The photoconductive element of claim 1 wherein said semiconducting layer is manufactured from at least one of amorphous silicon, omolybdenum sulphide, Indium Gallium Zinc Oxide, polycrystalline silicon, amorphous selenium, mercuric iodide, lead oxide, microcrystalline silicon, nanocrystalline silicon, crystalline silicon, PTCBI, and CuPc.

5. The photoconductive element of claim 1 wherein said insulator layer is manufactured from at least one of amorphous silicon nitride, amorphous silicon oxide, amorphous silicon oxynitride, polyimide, benzocyclobutene (BCB), and polystyrene.

6. The photoconductive element of claim 1 further comprising a scintillating phosphor layer is used to indirectly generate optical photons in response to incident high energy radiation photons.

7. The photoconductive element of claim 1 wherein the at least two detector element electrodes are embedded within the insulator layer.

8. The photoconductive element of claim 1 wherein the at least two detector element electrodes are deposited onto the surface of the insulator layer.

9. A photoconductive element for a digital X-ray imaging system, the photoconductive element comprising:
   a detector element including:
      a semiconducting layer for absorbing photons;
      at least two detector element electrodes spaced laterally apart; and
      an insulator layer having at least a first surface and a second surface wherein the first surface is in contact with the semiconducting layer and the second surface is in contact with the at least two detector element electrodes;
      wherein the semiconducting layer is not in contact with the at least two detector element electrodes; and
   a switching element wherein at least one layer within said switching element is in a same plane as either the semiconducting layer or the insulator layer of the detector element.

10. The photoconductive element of claim 9 wherein said detector element further comprises an anti-reflection layer.

11. The photoconductive element of claim 9 wherein said semiconducting layer is manufactured from at least one of amorphous silicon, molybdenum sulphide, Indium Gallium Zinc Oxide, polycrystalline silicon, amorphous selenium, mercuric iodide, lead oxide, microcrystalline silicon, nanocrystalline silicon, crystalline silicon, PTCBI, and CuPc.

12. The photoconductive element of claim 9 wherein said insulator layer is manufactured from at least one of amorphous silicon nitride, amorphous silicon oxide, amorphous silicon oxynitride, polyimide, benzocyclobutene (BCB), and polystyrene.

13. The photoconductive element of claim 9 further comprising a scintillating phosphor layer is used to indirectly generate optical photons in response to incident high energy radiation photons.

14. A radiography detector system comprising:
   a plurality of photoconductive elements, each of the plurality of photoconductive elements including:
      a detector element including:
         a semiconducting layer for absorbing photons;
         at least two detector element electrodes spaced laterally apart; and
         an insulator layer having at least a first surface and a second surface
         wherein the first surface is in contact with the semiconducting layer and the second surface is in contact with the at least two detector element electrodes, wherein the semiconducting layer is not in contact with the at least two detector element electrodes; and
      a switching element wherein at least one layer within said switching element is in a same plane as either the semiconducting layer or the insulator layer of the detector element;
   a row switching control driving a plurality of pixel gate lines;
   a charge amplifier circuit coupled to a plurality of pixel data lines;
   a multiplexer;
   a digitizer; and
   a control logic circuit.

15. The system of claim 14 wherein the detector element further comprises an anti-reflection layer.

16. The system of claim 14 wherein the switching element comprises a thin film transistor.

17. The system of claim 14 wherein the semiconducting layer of said detector element is manufactured from at least one of amorphous silicon, molybdenum sulphide, IGZO, polycrystalline silicon, amorphous selenium, mercuric iodide, lead oxide, microcrystalline silicon, nanocrystalline silicon, crystalline silicon, PTCBI, and CuPc.

18. The system of claim 14 wherein the insulator layer of said detector element is manufactured from at least one of amorphous silicon nitride, amorphous silicon oxide, amorphous silicon oxynitride, polyimide, and polystyrene.

19. The system of claim 14 wherein at least one of said electrodes is transparent.

20. The system of claim 14 further comprising a scintillating phosphor layer is used to indirectly generate optical photons in response to incident high energy radiation photons.

* * * * *